(12) United States Patent
Yeh et al.

(10) Patent No.: US 8,054,686 B2
(45) Date of Patent: *Nov. 8, 2011

(54) FLASH MEMORY STORAGE APPARATUS, FLASH MEMORY CONTROLLER, AND SWITCHING METHOD THEREOF

(75) Inventors: Chih-Kang Yeh, Kinmen County (TW); Chih-Jen Lee, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/889,815

(22) Filed: Sep. 24, 2010

(65) Prior Publication Data
US 2011/0022786 A1 Jan. 27, 2011

Related U.S. Application Data

(62) Division of application No. 12/047,119, filed on Mar. 12, 2008, now Pat. No. 7,864,572.

(30) Foreign Application Priority Data

Jan. 7, 2008 (TW) ................................ 97100552 A (51) Int. Cl.
*G11C 16/04* (2006.01)
(52) U.S. Cl. .................................................. 365/185.03
(58) Field of Classification Search .................. None
See application file for complete search history.

(56) References Cited

U.S. PATENT DOCUMENTS

| 6,075,723 | A | 6/2000 | Naiki et al. | 365/185.03 |
| 6,657,891 | B1 | 12/2003 | Shibata et al. | 365/185.03 |
| 7,656,709 | B2* | 2/2010 | Goda et al. | 365/185.17 |
| 2008/0172521 | A1* | 7/2008 | Lee | 711/103 |

OTHER PUBLICATIONS

Chinese First Examination Report of China Application No. 200810005170.3, dated Aug. 31, 2010.

* cited by examiner

*Primary Examiner* — Huan Hoang
*Assistant Examiner* — James G Norman
(74) *Attorney, Agent, or Firm* — J.C. Patents (57) ABSTRACT

A flash memory storage apparatus including a multi level cell (MLC) NAND flash memory, a flash memory controller, and a host transmission bus is provided. The MLC NAND flash memory includes a plurality of blocks for storing data, wherein each of the blocks has an upper page and a lower page, and the writing speed of the lower page is faster than that of the upper page. The flash memory controller is electrically connected to the MLC NAND flash memory and is used for executing storage mode switching steps. The host transmission bus is electrically connected to the flash memory controller and is used for communicating with a host. The flash memory storage apparatus provided by the present invention can provide multiple storage modes in order to store different data.

14 Claims, 9 Drawing Sheets

| Lower page | Uppe page | Lower page | Uppe page | Lower page | Uppe page | Lower page | Uppe page |
|---|---|---|---|---|---|---|---|
| 0 | 1 | 32 | 33 | 64 | 65 | 96 | 97 |
| 2 | 3 | 34 | 35 | 66 | 67 | 98 | 99 |
| 4 | 5 | 36 | 37 | 68 | 69 | 100 | 101 |
| 6 | 7 | 38 | 39 | 70 | 71 | 102 | 101 |
| 8 | 9 | 40 | 41 | 72 | 73 | 104 | 105 |
| 10 | 11 | 42 | 43 | 74 | 75 | 106 | 107 |
| 12 | 13 | 44 | 45 | 76 | 77 | 108 | 109 |
| 14 | 15 | 46 | 47 | 78 | 79 | 110 | 111 |
| 16 | 17 | 48 | 49 | 80 | 81 | 112 | 113 |
| 18 | 19 | 50 | 51 | 82 | 83 | 114 | 115 |
| 20 | 21 | 52 | 53 | 84 | 85 | 116 | 117 |
| 22 | 23 | 54 | 55 | 86 | 87 | 118 | 119 |
| 24 | 25 | 56 | 57 | 88 | 89 | 120 | 121 |
| 26 | 27 | 58 | 59 | 90 | 91 | 122 | 123 |
| 28 | 29 | 60 | 61 | 92 | 93 | 124 | 125 |
| 30 | 31 | 62 | 63 | 94 | 95 | 126 | 127 |

FLASH MEMORY STORAGE APPARATUS, FLASH MEMORY CONTROLLER, AND SWITCHING METHOD THEREOF

CROSS-REFERENCE TO RELATED APPLICATION

This is a divisional application of patent application Ser. No. 12/047,119, filed on Mar. 12, 2008, which claims the priority benefit of Taiwan patent application serial no. 97100552, filed on Jan. 7, 2008. The entirety of each of the above-mentioned patent applications is hereby incorporated by reference herein and made a part of this specification.

BACKGROUND

1. Technology Field

The present invention generally relates to a storage apparatus, in particular, to a storage apparatus having a plurality of storage modes, a flash memory controller, and a switching method thereof.

2. Description of Related Art

Along with the widespread of digital cameras, camera phones, and MP3 in recently years, the consumers' demand to storage media has increased drastically too. Flash memory is one of the most adaptable memories for such battery-powered portable products due to its characteristics such as data non-volatility, low power consumption, small volume, and non-mechanical structure. Besides being applied in foregoing portable products, flash memory is also broadly applied to external products such as flash cards and flash disks. Thereby, flash memory has become one of the most focused electronic products in recent years.

A flash disk usually uses a control IC and a flash memory to communicate with a personal computer (PC) through a data transmission interface. The most commonly adopted data transmission interface is universal serial bus (USB). Due to the characteristics of USB transmission interfaces, flash disks offer plug-and-play and hot plugging functions. Besides, since most existing PCs come with USB interfaces, the application range of flash disks is greatly increased. When a user want to access data in a PC through a flash disk, the user does not have to re-start the PC as what he/she would do when the hardware configuration of the PC is changed. In other words, once the USB plug of a flash disk is plugged into a host computer, the operating system in the host computer instantly assigns a slot as the space for accessing the flash disk so that data can be directly accessed. From users' point of view, flash disks provide a lot of convenience. Moreover, a flash disk is usually designed very light, slim, and small but at the same time has a large storage capacity and can be read or written repeatedly. Thereby, flash disk has become the mainstream in today's storage media market.

Flash memories in flash disks can be categorized into single level cell (SLC) NAND flash memories and multi level cell (MLC) NAND flash memories according to the memory cells thereof. Due to the physical characteristics of MLC NAND flash memory, charges in some pages are not very stable and which may affect the adjacent pages. Accordingly, the reliability of MLC NAND flash memory is not very satisfactory even though it can provide a large storage capacity. Contrarily, the speed and durability of a SLC NAND flash memory are both better than those of a MLC NAND flash memory, but a SLC NAND flash memory offers a smaller storage capacity than a MLC NAND flash memory with the same chip size. Thus, a user can choose different types of flash disks according to the storing requirements of different data. For example, the reliability of a flash disk has to be considered when important data is to be stored, and a memory with large storage capacity should be used for storing less important data in large quantity. However, several flash disks having different flash memories have to be carried around in order to store different data, which is very inconvenient.

Accordingly, a flash memory storage apparatus which provides multiple storage modes is desired.

SUMMARY

Accordingly, the present invention is directed to a flash memory storage apparatus which provides a plurality of storage modes in order to store different data.

The present invention is directed to a flash memory controller which executes a plurality of storage modes in a multi level cell (MLC) NAND flash memory for storing different data.

The present invention is directed to a storage mode switching method which executes a plurality of storage modes in a MLC NAND flash memory for storing different data.

The present invention provides a flash memory storage apparatus including at least one MLC NAND flash memory, a flash memory controller, and a host transmission bus. The MLC NAND flash memory has a plurality of blocks for storing data, wherein each of the blocks includes an upper page and a lower page, and the writing speed of the lower page is faster than that of the upper page. The flash memory controller is electrically connected to the MLC NAND flash memory and is used for executing storage mode switching steps. The host transmission bus is electrically connected to the flash memory controller and is used for communicating with a host.

According to an embodiment of the present invention, the flash memory controller executes the storage mode switching steps to switch the storage mode of the flash memory storage apparatus to a performance mode or a space mode.

According to an embodiment of the present invention, the flash memory controller further executes the storage mode switching steps to switch the storage mode of the flash memory storage apparatus to a hybrid mode.

According to an embodiment of the present invention, the flash memory controller executes the storage mode switching steps according to an instruction transmitted by an application program in the host.

According to an embodiment of the present invention, the flash memory storage apparatus further includes a selection switch, and a user uses the selection switch to select a desired storage mode.

According to an embodiment of the present invention, the upper pages include a plurality of pages having different writing speeds.

According to an embodiment of the present invention, the blocks can be grouped into a first division and a second division when the storage mode is the hybrid mode, wherein the flash memory controller uses only the lower pages of the blocks for storing data in the first division and uses both the upper pages and lower pages of the blocks for storing data in the second division.

According to an embodiment of the present invention, the flash memory controller uses only the lower pages of the blocks for storing data when the storage mode is the performance mode.

According to an embodiment of the present invention, the flash memory controller uses both the upper pages and the lower pages of the blocks for storing data when the storage mode is the space mode.

The present invention provides a flash memory controller suitable for a flash memory storage apparatus. A flash memory in the flash memory storage apparatus is a MLC NAND flash memory, wherein each block in the flash memory includes an upper page and a lower page, and the writing speed of the lower page is faster than that of the upper page. The flash memory controller includes a microprocessor unit, a flash memory interface, a buffer memory, and a memory management module. The flash memory interface is electrically connected to the microprocessor unit and is used for accessing the flash memory. The buffer memory is electrically connected to the microprocessor unit and is used for temporarily storing data. The memory management module is electrically connected to the microprocessor unit and is used for executing storage mode switching steps.

According to an embodiment of the present invention, the memory management module executes the storage mode switching steps to switch the storage mode of the flash memory storage apparatus to a performance mode or a space mode.

According to an embodiment of the present invention, the memory management module further executes the storage mode switching steps to switch the storage mode of the flash memory storage apparatus to a hybrid mode.

According to an embodiment of the present invention, the memory management module executes the storage mode switching steps according to an instruction transmitted by an application program in a host.

According to an embodiment of the present invention, the flash memory controller further includes a selection switch circuit for detecting the storage mode to be used by a user.

According to an embodiment of the present invention, the blocks can be grouped into a first division and a second division when the storage mode is the hybrid mode, wherein the memory management module uses only the lower pages of the blocks for storing data in the first division and uses both the upper pages and the lower pages for storing data in the second division.

According to an embodiment of the present invention, the memory management module uses only the lower pages of the blocks for storing data when the storage mode is the performance mode.

According to an embodiment of the present invention, the memory management module uses both the upper pages and the lower pages of the blocks for storing data when the storage mode is the space mode.

According to an embodiment of the present invention, the flash memory storage apparatus is a USB flash disk, a flash memory card, or a solid state drive (SSD).

The present invention provides a storage mode switching method suitable for a flash memory storage apparatus, wherein a flash memory of the flash memory storage apparatus is a MLC NAND flash memory, each of a plurality of blocks in the flash memory includes an upper page and a lower page, and the writing speed of the lower page is faster than that of the upper page. The storage mode switching method includes: switching the storage mode of the flash memory storage apparatus to a space mode, wherein both the upper pages and the lower pages of the blocks in the flash memory are used for storing data; and switching the storage mode of the flash memory storage apparatus to a performance mode, wherein only the lower pages of the blocks in the flash memory are used for storing data.

According to an embodiment of the present invention, the storage mode switching method further includes: switching the storage mode of the flash memory storage apparatus to a hybrid mode, wherein only the lower pages are used for storing data in some blocks of the flash memory, while both the upper pages and the lower pages are used for storing data in the other blocks of the flash memory.

According to an embodiment of the present invention, the storage mode switching method further includes: grouping the blocks in the flash memory into a first division and a second division when the storage mode is switched to the hybrid mode, wherein only the lower pages of the blocks are used for storing data in the first division, and both the upper pages and lower pages of the blocks are used for storing data in the second division.

According to an embodiment of the present invention, the storage mode switching method further includes: temporarily storing the existing data in the flash memory storage apparatus to a storage medium of a host when the storage mode of the flash memory storage apparatus is switched; and storing the existing data back to the flash memory storage apparatus after the switching is completed.

According to an embodiment of the present invention, the storage mode switching method further includes: temporarily storing the existing data in a currently switched block to an unused block in the flash memory when the storage mode of the flash memory storage apparatus is switched; and storing the existing data back to the switched block and updating the file system information of the flash memory storage apparatus after the switching is completed.

According to an embodiment of the present invention, the storage mode of the flash memory storage apparatus is switched according to an instruction transmitted by an application program in the host.

The present invention provides a flash memory storage apparatus including at least one MLC NAND flash memory, a flash memory controller, and a host transmission bus. The MLC NAND flash memory has a plurality of blocks for storing data, wherein each of the blocks has an upper page and a lower page, and the writing speed of the lower page is faster than that of the upper page. The flash memory controller is electrically connected to the MLC NAND flash memory and is used for providing only the upper page in at least one block for storing data for a host. The host transmission bus is electrically connected to the flash memory controller and is used for communicating with the host.

According to the present invention, the flash memory storage apparatus, the flash memory controller, and the operation method thereof provide a storage mode switching function such that multiple storage modes can be provided in order to store different data.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

According to the present invention, a flash memory storage system includes a multi level cell (MLC) NAND flash memory, a flash memory controller, and a host transmission bus. The flash memory controller executes a storage mode switching function to store data in a plurality of modes (for example, by using the upper pages, the lower pages, or a combination thereof) of blocks in the MLC NAND flash memory), so as to meet the users' requirement of storing different data. Embodiments of the present invention will be described in detail below with reference to accompanying drawings.

First Embodiment

Figure 1:
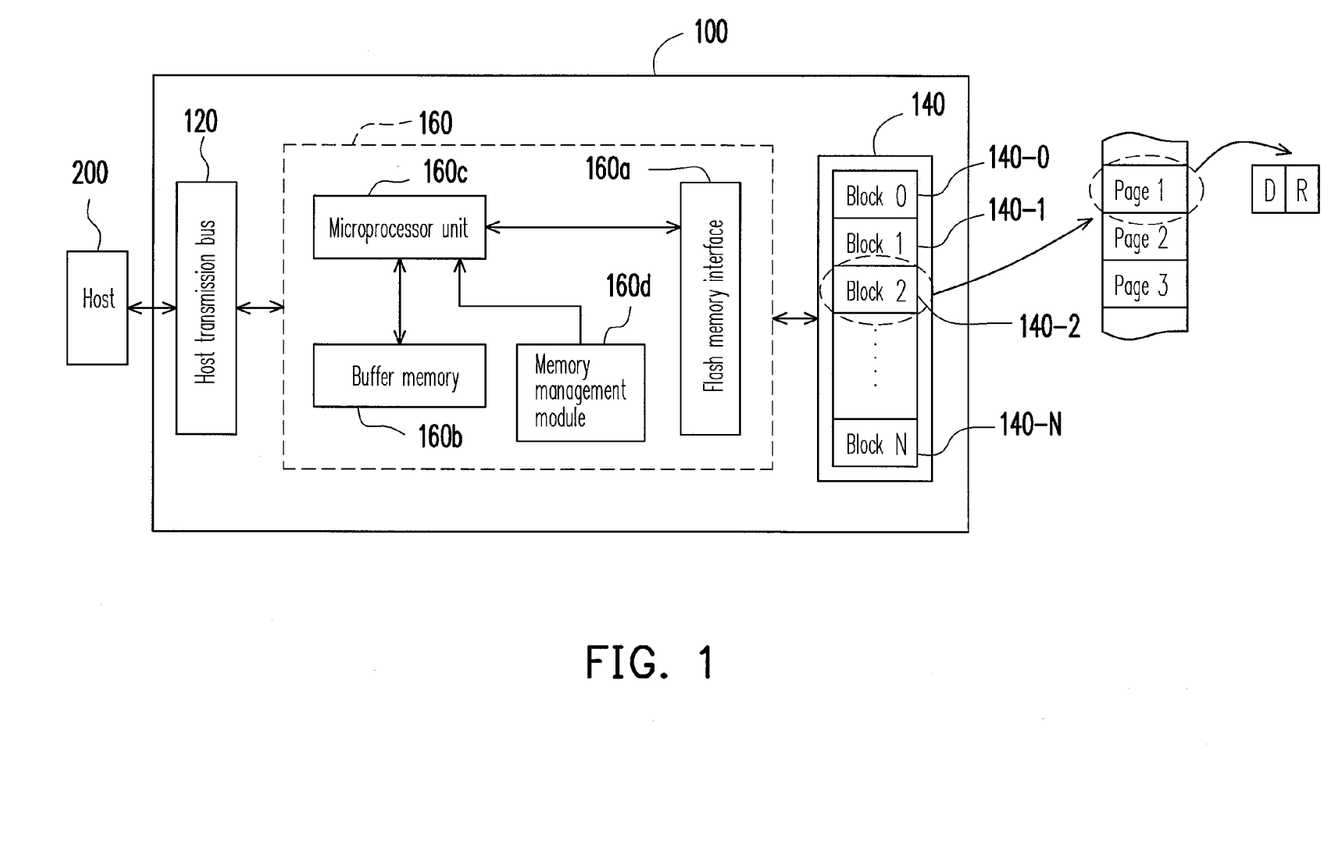
FIG. 1 is a block diagram of a storage apparatus having multiple storage modes according to a first embodiment of the present invention.

FIG. 1 is a block diagram of a storage apparatus having a plurality of storage modes according to a first embodiment of the present invention.

Referring to FIG. 1, the flash memory storage apparatus 100 includes a host transmission bus 120, a MLC NAND flash memory 140, and a flash memory controller 160.

The host transmission bus 120 is electrically connected to the flash memory controller 160 and is used for communicating with a host 200. In other words, the host 200 can access the flash memory storage apparatus 100 through the host transmission bus 120. To be more specific, the host 200 can store data into the flash memory storage apparatus 100 through the host transmission bus 120 or read data stored in the flash memory storage apparatus 100 through the host transmission bus 120. In the present embodiment, the host transmission bus 120 is a universal serial bus (USB) interface. However, the present invention is not limited thereto, and in another embodiment of the present invention, the host transmission bus 120 may also be an IEEE 1394 interface, a SATA interface, a PCI Express interface, a MS interface, a SAS interface, a MMC interface, a SD interface, a CF interface, an IDE interface, or other suitable data transmission interfaces. The host 200 may be a computer, a digital camera, a video camera, a communication device, an audio player, or a video player. Generally speaking, the host 200 may be substantially any system which can store data.

The MLC NAMD flash memory 140 is electrically connected to the flash memory controller 160 and used for storing data. The MLC NAMD flash memory 140 is substantially divided into a plurality of physical blocks 140-0~140-N, and for the convenience of description, these physical blocks will be referred as blocks thereinafter. Generally speaking, block is the smallest unit for erasing data in a flash memory. In other words, each block contains the smallest number of memory cells which are erased together. Each block is usually divided into a plurality of pages. Page is the smallest programming unit. However, it has to be noted that the smallest programming unit may also be sector in some other flash memory designs. Namely, a page is further divided into a plurality of sectors and each sector is considered the smallest programming unit. In other words, page is the smallest unit for writing or reading data. A page usually includes a user data area D and a redundant area R, wherein the user data area D is used for storing user data, and the redundant area R is used for storing system data (for example, an error correcting code).

Generally, the user data area D has 512 bytes and the redundant area R has 16 bytes in order to correspond to the size of a sector in a disk drive. Namely, a page is a sector. However, a page may also be composed of multiple sectors. For example, a page may include four sectors. Generally speaking, a block may contain any number of pages, for example, 64 pages, 128 pages, and 256 pages etc. The blocks 224-0~224-N are usually grouped into a plurality of zones. By managing the operations of a flash memory which are independent to each other to certain degree by zones, operation parallelism can be improved and the complexity for managing the operations can be simplified.

Figure 2:
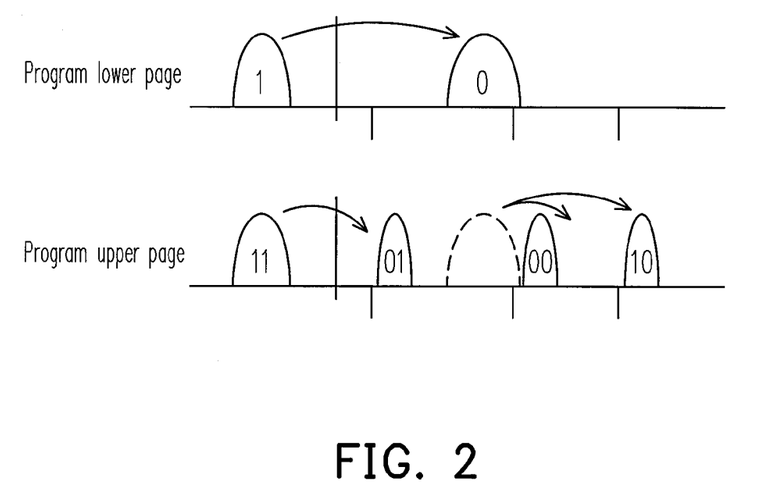
FIG. 2 is a diagram illustrating the programming of a multi level cell (MLC) NAND flash memory.

The programming of a MLC NAND flash memory can be divided into multiple phases. Taking a 4-level cell NAND flash memory as an example, this flash memory can be programmed in two phases. As shown in FIG. 2, the lower pages are written during the first phase, and the physical characteristics thereof are similar to those of a SLC NAND flash memory. The upper pages are programmed after the first phase is completed. The writing speed of the lower pages is faster than that of the upper pages. In particular, the upper pages and the lower pages have a coupling relationship. In other words, instability of the lower pages (i.e. data may be lost) may be caused if an error occurs during the programming of the upper pages. This is why the reliability of MLC NAND flash memories is lower than that of SLC NAND flash memories. Similarly, in an 8-level or 16-level cell NAND flash memory, a memory cell includes more pages and accordingly data is written in more phases. Namely, a block may contain pages having two or more writing speeds, and these pages may be categorized into upper pages, middle pages, and lower pages according to the writing speeds thereof, wherein those pages having the fastest writing speed are considered as lower pages, and all the other pages having slower writing speeds are considered as upper pages. The upper pages may contain pages having different writing speeds (two or more). In other words, by categorizing the lower pages and upper pages in a 4-level cell NAND flash memory according to the writing speeds thereof, those lower pages having faster writing speeds may also be considered as fast pages, and those upper pages having slower writing speeds may also be considered as slow pages. In addition, the pages may also be categorized into fast pages, middle pages, and slow pages respectively having different writing speeds in different NAND flash memory designs. Namely, each block in a MLC flash memory has pages of different writing speeds, and these pages can be categorized into two, three, or more groups according to the writing speeds thereof, wherein the categorization may vary along with the hardware design of the MLC flash memory.

The flash memory controller 160 is used for controlling, for example, storing operations, reading operations, and erasing operations of data. In particular, the flash memory controller 160 executes a storage mode switching function (or storage mode switching steps) to switch the storage mode of the flash memory storage apparatus 100 into a performance mode or a space mode. In another embodiment of the present invention, the storage mode may also be switched to a hybrid mode.

Figure 3:
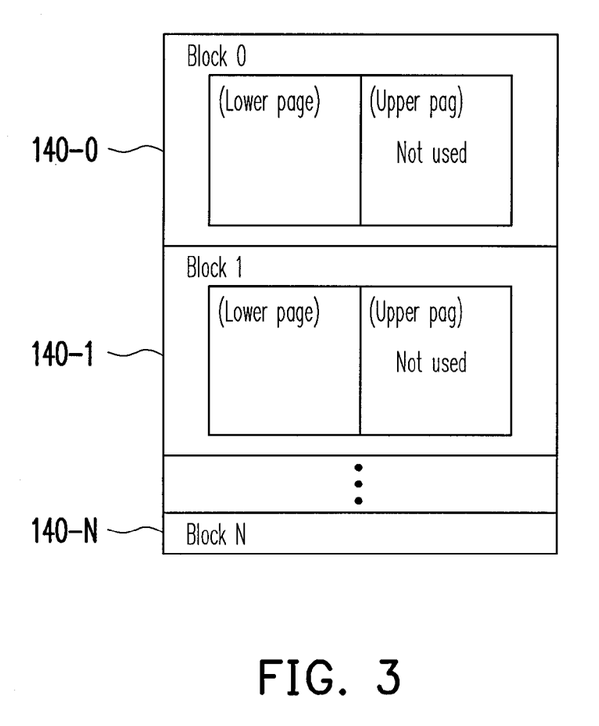
FIG. 3 is a diagram illustrating the process of using only a lower page in a block for storing data according to an embodiment of the present invention.

As described above, the programming of a block in a MLC NAND flash memory can be divided into multiple phases. Taking a 4-level cell NAND flash memory as an example, each block in the flash memory can be divided into an upper page and a lower page, wherein the writing speed of the lower page is faster than that of the upper page. In the MLC NAND flash memory, the physical operation for storing data into a block is the same as that of a SLC NAND flash memory if only the lower page of the block is used for storing data (as shown in FIG. 3). In such a case, the data writing speed and the data reliability can be improved even though the storage capacity is greatly reduced (for example, the capacity of a 4-level cell NAND flash memory is only ½ of the original capacity thereof). It has to be noted here that the lower pages in FIG. 3 refer to multiple pages having the fastest writing speed, and the upper pages refer to multiple pages having lower writing speeds.

In the present embodiment, the flash memory storage apparatus 100 in the performance mode operates by using only the lower pages of the blocks to achieve the optimal operation performance. For example, a higher access speed is required when the ready-boost function is used. Contrarily, the flash memory storage apparatus 100 in the space mode uses both the upper pages and the lower pages of the blocks for storing data so as to achieve the maximum storage capacity. In the hybrid mode, the flash memory storage apparatus 100 uses only the lower pages in some blocks for storing data and uses both the upper pages and the lower pages in other blocks for storing data. Taking a 4-level cell NAND flash memory as an example, assuming that the MLC NAND flash memory in a storage apparatus is 8 GB, the complete storage capacity 8 GB can be used if the storage mode of the flash memory is set to the space mode, and the usable storage capacity is only 4 GB if the storage mode thereof is set to the performance mode since only the lower pages are used for storing data, and if the storage mode is set to the hybrid mode, P % of the entire flash memory can be adjusted into the performance mode and (100−P %) of the flash memory can adjusted into the space mode according to the user's requirement, wherein the storage capacity can be expressed as:

$$\text{Usable capacity} = \text{capacity of MLC NAND flash memory} * (1 - P\%/2)$$

For example, if 50% of a flash memory having originally 8 GB is set to the performance mode, and the other 50% thereof is set to the space mode, the usable capacity thereof is 6 GB.

In another embodiment of the present invention, the blocks can be logically grouped into a first division (for example, the C drive indicated in an operating system) and a second division (for example, the D drive indicated in an operating system) when the storage mode is set to the hybrid mode, wherein only the lower pages of the blocks are used for storing data in the first division, and both the upper pages and the lower pages of the blocks are used for storing data in the second division. For example, the first division having faster writing speed is used for storing application programs and the second division is used for storing general data so that both the requirements to access performance and storage capacity can be met. This application is very valuable in solid state drives (SSDs). The storage mode switching steps will be described in detail with reference to FIG. 4.

The aforementioned performance mode, space mode, and hybrid mode respectively refer to the situations wherein only the lower pages, both the upper pages and the lower pages, or only the lower pages in some blocks while both the upper pages and the lower pages are used for storing data. However, in another embodiment of the present invention, the flash memory storage apparatus 100 may be controlled to use only the upper page in at least one block for storing data so as to achieve stability of data storage.

Figure 4:
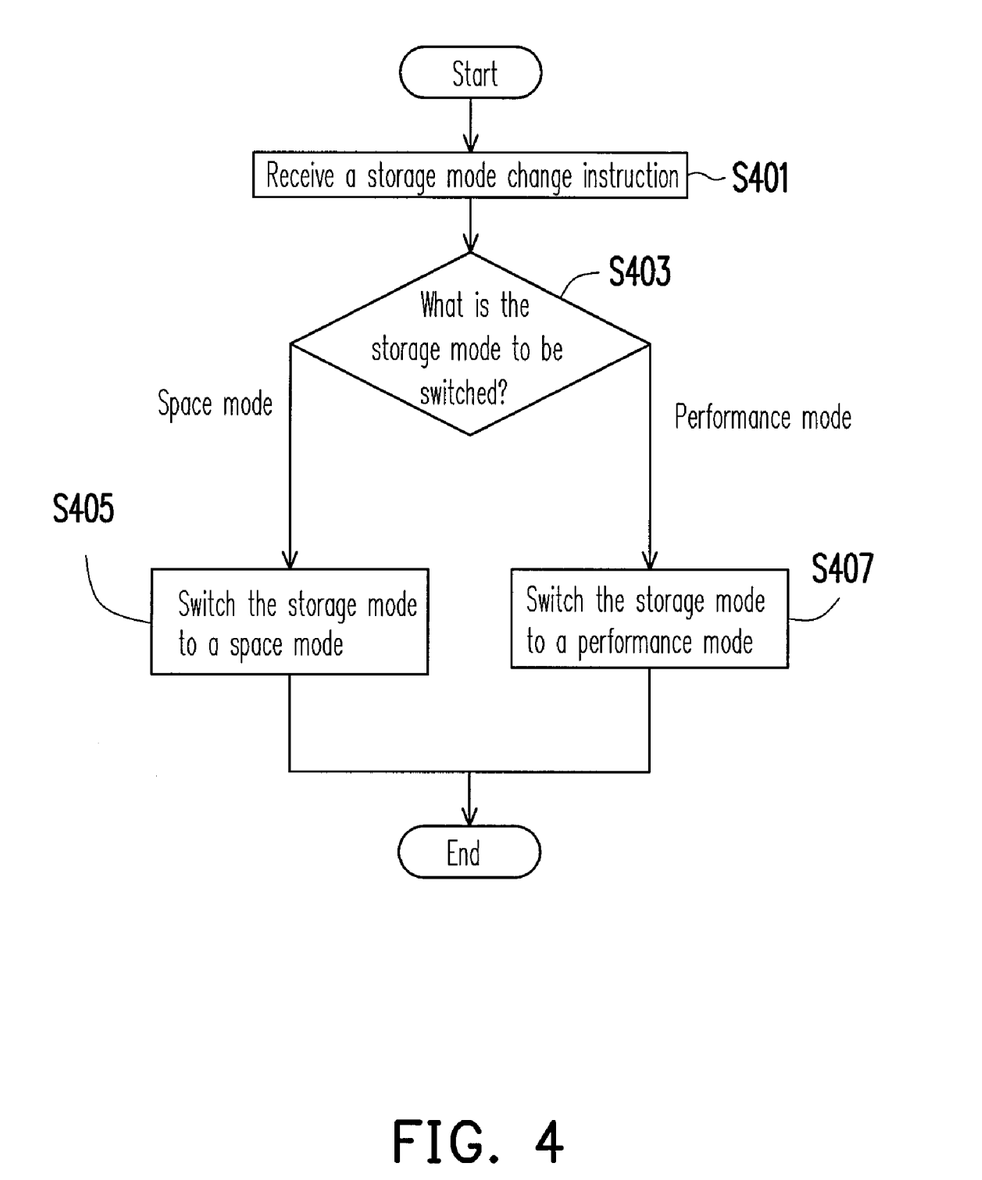
FIG. 4 is a flowchart of a storage mode switching method according to the first embodiment of the present invention.

FIG. 4 is a flowchart of a storage mode switching method according to the first embodiment of the present invention.

Referring to FIG. 4, in step S401, the flash memory storage apparatus 100 receives a storage mode change instruction. In the present embodiment, the storage mode change instruction is transmitted by an application program installed in the host 200. To be specific, when the flash memory storage apparatus 100 is connected to the host 200 and is in operation, a user may issue a storage mode change instruction by executing the application program installed in the host.

In step S403, the storage mode to be switched is determined according to the storage mode change instruction. If it is determined in step S403 that the storage mode to be switched is the space mode, the storage mode is switched to the space mode in step S405, namely, both the upper pages and the lower pages of the blocks in the MLC NAMD flash memory 140 are used for storing data. If it is determined in step S403 that the storage mode to be switched is the performance mode, the storage mode is switched to the performance mode in step S407, namely, only the lower pages of the blocks in the MLC NAMD flash memory 140 are used for storing data (as shown in FIG. 3).

In another embodiment of the present invention, steps S405 and S407 further include re-formatting the MLC NAMD flash memory 140 through low level formatting.

Figure 5:
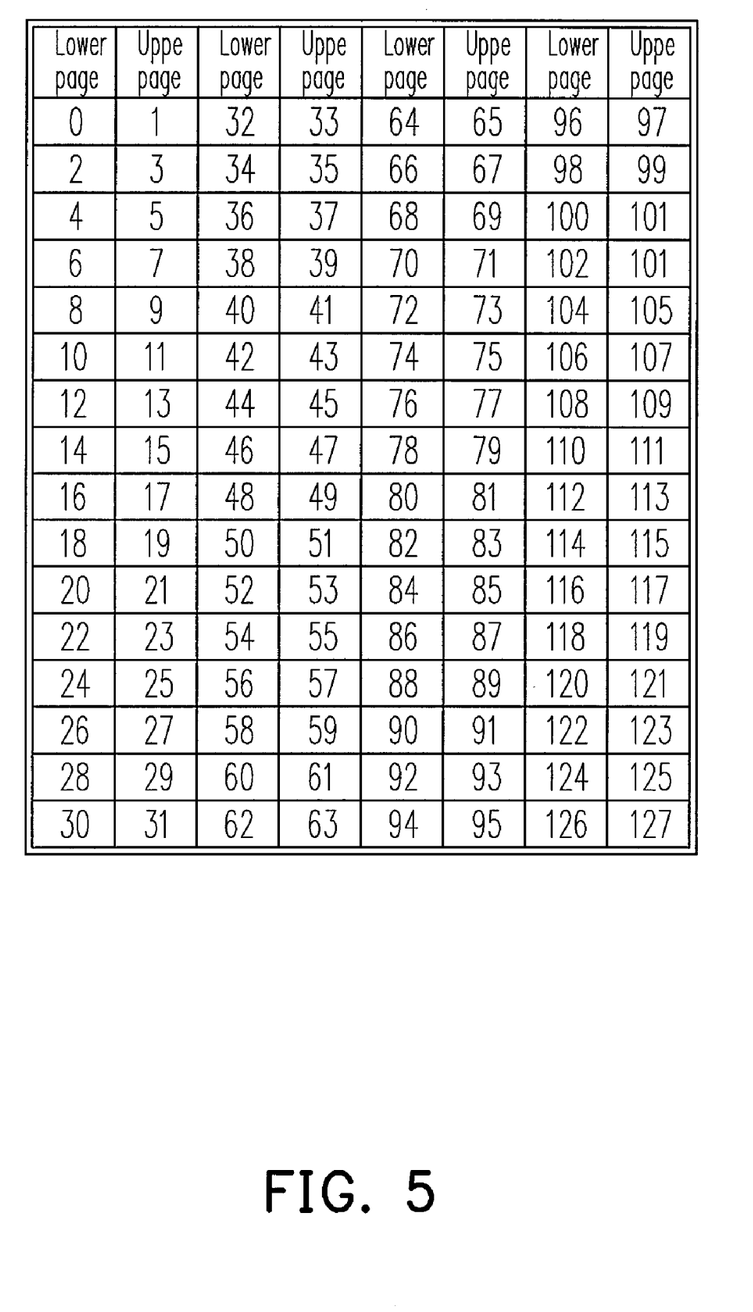
FIG. 5 illustrates examples of physical addresses of pages in a MLC NAND flash memory.

Only specific pages are used for storing data by switching the storage mode to the performance mode or the space mode. In another embodiment of the present invention, the storage mode switching method further includes establishing a page lookup table (as shown in FIG. 5) for recording the physical addresses of the lower pages and the upper pages in the memory, wherein the physical addresses are used by the flash memory controller 160 for writing data.

Referring to FIG. 1 again, the flash memory controller 160 includes a flash memory interface 160a, a buffer memory 160b, a microprocessor unit 160c, and a memory management module 160d.

The flash memory interface 160a is electrically connected to the microprocessor unit 160c and is used for accessing the MLC NAND flash memory 140. Namely, the data to be written by the host 200 is first converted by the flash memory interface 160a into a format acceptable to the MLC NAND flash memory 140.

The buffer memory 160b is electrically connected to the microprocessor unit 160c and is used for temporarily storing system data (for example, a mapping table) or the data to be read or written by the host. In the present embodiment, the buffer memory 160b is a static random access memory (SRAM). However, the present invention is not limited thereto, and a dynamic RAM (DRAM), a magnetoresistive RAM (MRAM), a phase-change RAM (PRAM), or other suitable memories may also be applied in the present invention.

The microprocessor unit 160c is used for controlling operations of other components in the flash memory controller 160.

The memory management module 160d is electrically connected to the microprocessor unit 160c and is used for managing the MLC NAND flash memory 140, such as executing a wear levelling procedure, managing bad blocks, and maintaining a mapping table etc. In the present embodiment, the memory management module 160*d* executes the storage mode switching steps described above.

Figure 6:
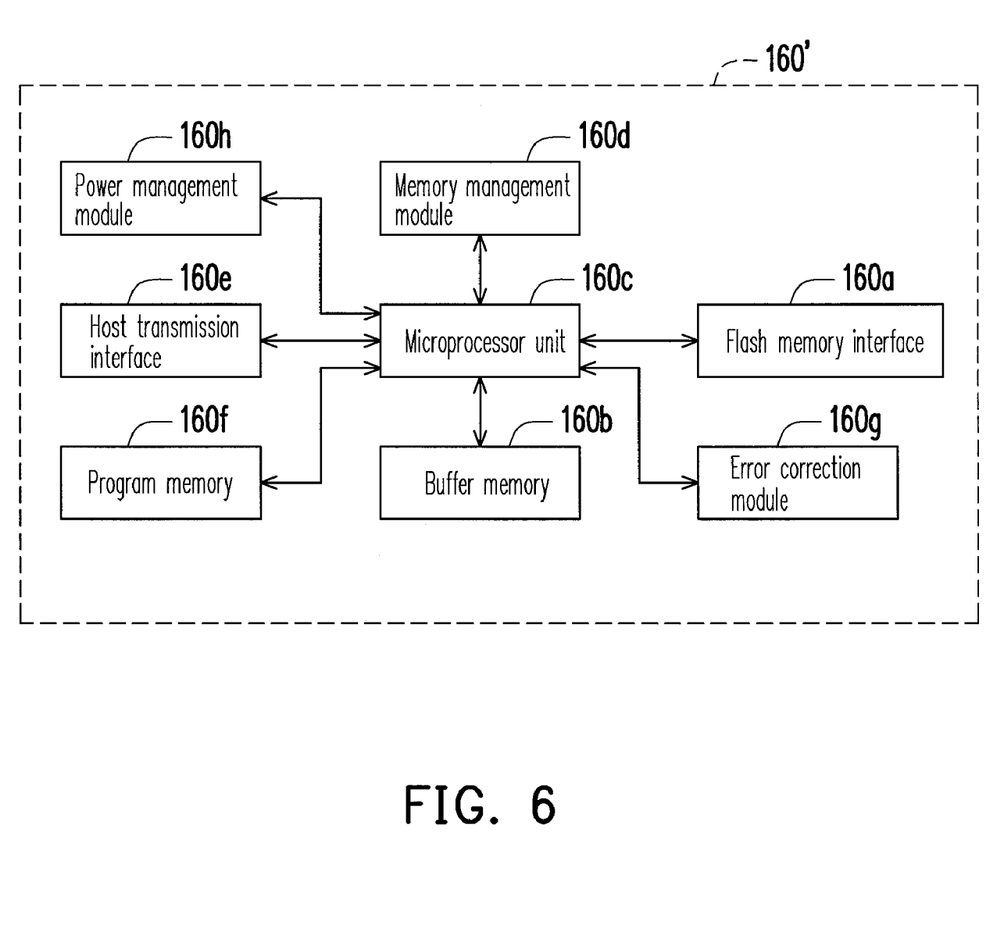
FIG. 6 is a detailed block diagram of a flash memory controller according to another embodiment of the present invention.

In another embodiment of the present invention, the flash memory controller further includes a host transmission interface 160*e*, a program memory 160*f*, an error correction module 160*g*, and a power management module 160*h* (as the flash memory controller 160' shown in FIG. 6).

The host transmission interface 160*e* is electrically connected to the microprocessor unit 160*c* and is used for communicating with the host 200, and the host transmission interface 160*e* may be a USB interface, an IEEE 1394 interface, a SATA interface, a PCI Express interface, a MS interface, a MMC interface, a SD interface, a CF interface, or an IDE interface corresponding to the host transmission bus 120 of the flash memory storage apparatus 100.

The program memory 160*f* is electrically connected to the microprocessor unit 160*c* and is used for storing a program code executed by the flash memory controller for controlling the flash memory storage apparatus 100.

The error correction module 160*g* is electrically connected to the microprocessor unit 160*c* and is used for calculating an error correcting code (ECC) for checking and correcting the data to be read or written by the host.

The power management module 160*h* is electrically connected to the microprocessor unit 160*c* and is used for managing the power supply of the flash memory storage apparatus 100.

In another embodiment of the present invention, the flash memory storage apparatus 100 further includes a selection switch (not shown). A user can use the selection switch to select a desired storage mode, and a selection signal is transmitted to the flash memory controller to replace the storage mode change instruction transmitted by the application program in the host 200. In the present embodiment, the flash memory controller further includes a selection switch circuit for detecting the desired storage mode of the user.

Figure 7:
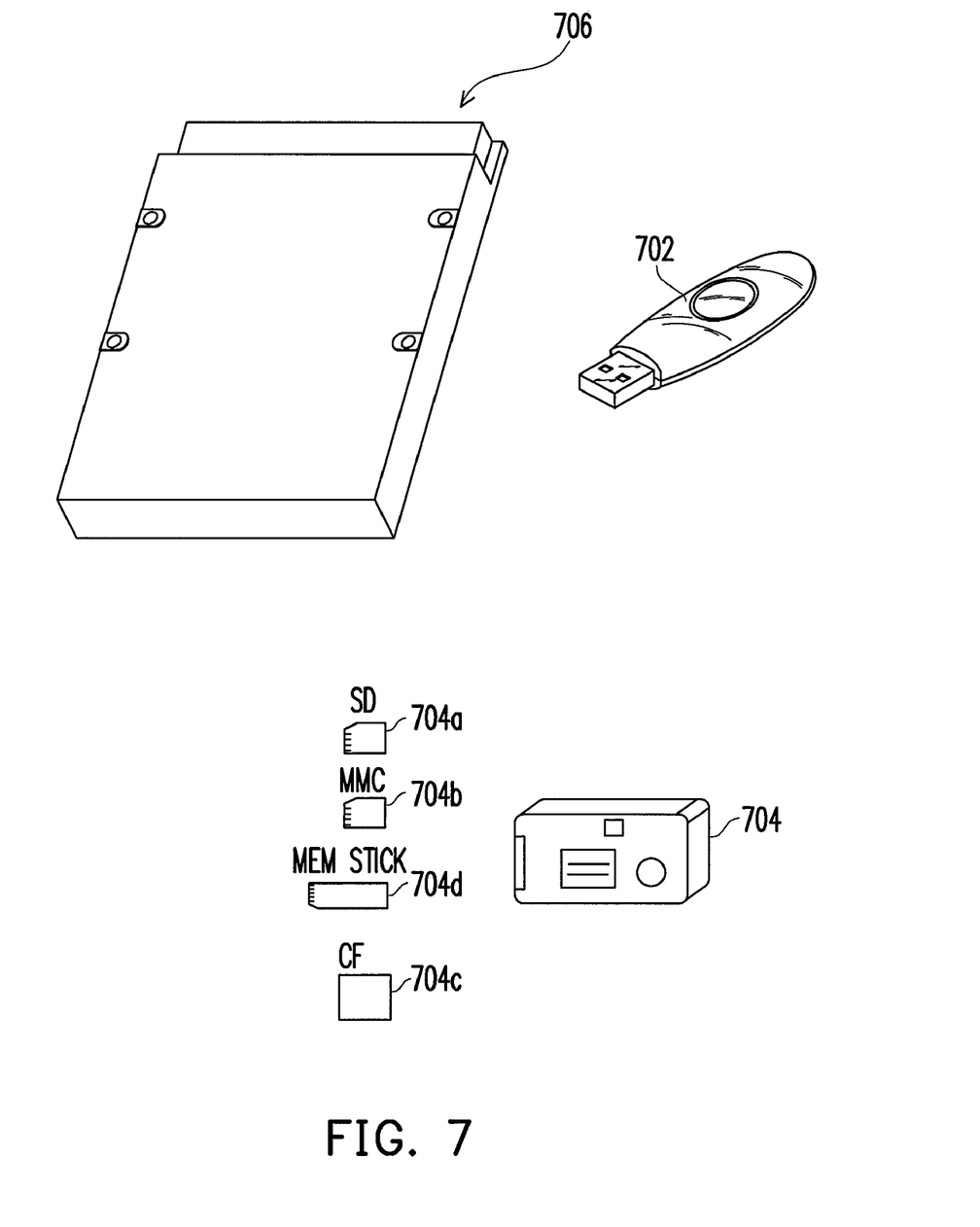
FIG. 7 is a diagram of a flash memory storage apparatus according to an embodiment of the present invention.

In the present embodiment, the flash memory storage apparatus 100 is a USB flash disk 702. However, the present invention is not limited thereto, and the storage apparatus may also be a SD card 704*a*, a MMC card 704*b*, a CF card 704*c*, and a memory stick 704*d* in a digital camera (video camera) 704 and a solid state drive (SSD) 706 having foregoing elements (as shown in FIG. 7).

Second Embodiment

The hardware structure and the operation of the flash memory in the second embodiment of the present invention are the same as those in the first embodiment (as illustrated in FIGS. 1, 2, 3, 5, 6, and 7) therefore will not be described herein. The difference between the two embodiments is that in the second embodiment, the storage mode in the storage mode switching method further includes a hybrid mode.

Figure 8:
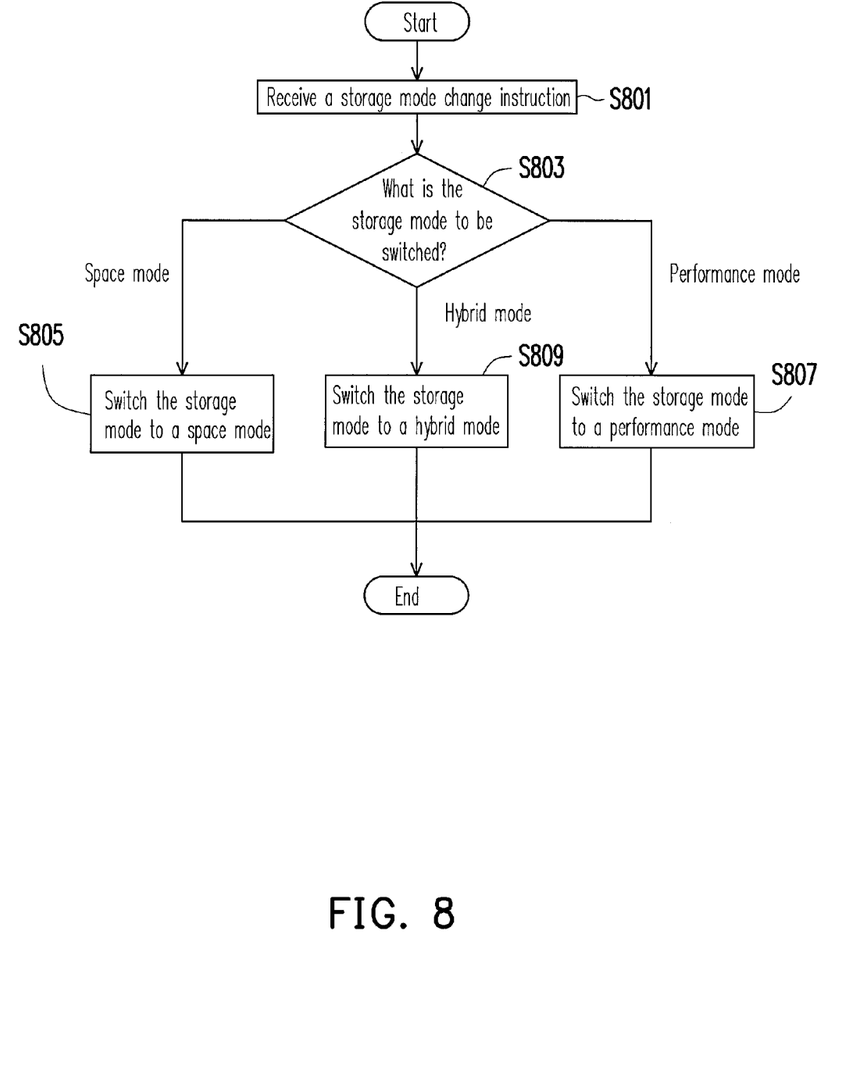
FIG. 8 is a flowchart of a storage mode switching method according to a second embodiment of the present invention.

FIG. 8 is a flowchart of a storage mode switching method according to the second embodiment of the present invention.

Referring to FIG. 8, the flowchart illustrated in FIG. 8 is substantially the same as that illustrated in FIG. 4, and the difference is that the step S803 in FIG. 8 further includes determining whether the desired storage mode is a hybrid mode compared to step S403 in FIG. 4. In step S809, the storage mode is switched to the hybrid mode, namely, only the lower pages are used for storing data in some blocks of the MLC NAMD flash memory 140 while both the lower pages and the upper pages are used for storing data in the other blocks of the MLC NAMD flash memory 140.

The steps S801, S805, and S807 in FIG. 8 are similar to the steps S401, S405, and S407 in FIG. 4 therefore will not be described herein.

Third Embodiment

The hardware structure and the operation of the flash memory in the third embodiment of the present invention are the same as those in the first embodiment (as illustrated in FIGS. 1, 2, 3, 5, 6, and 7) therefore will not be described herein. The difference between the third embodiment and the second embodiment is that in the third embodiment of the present invention, a mechanism for determining whether the user is about to keep the existing data in the storage apparatus is further included.

Figure 9:
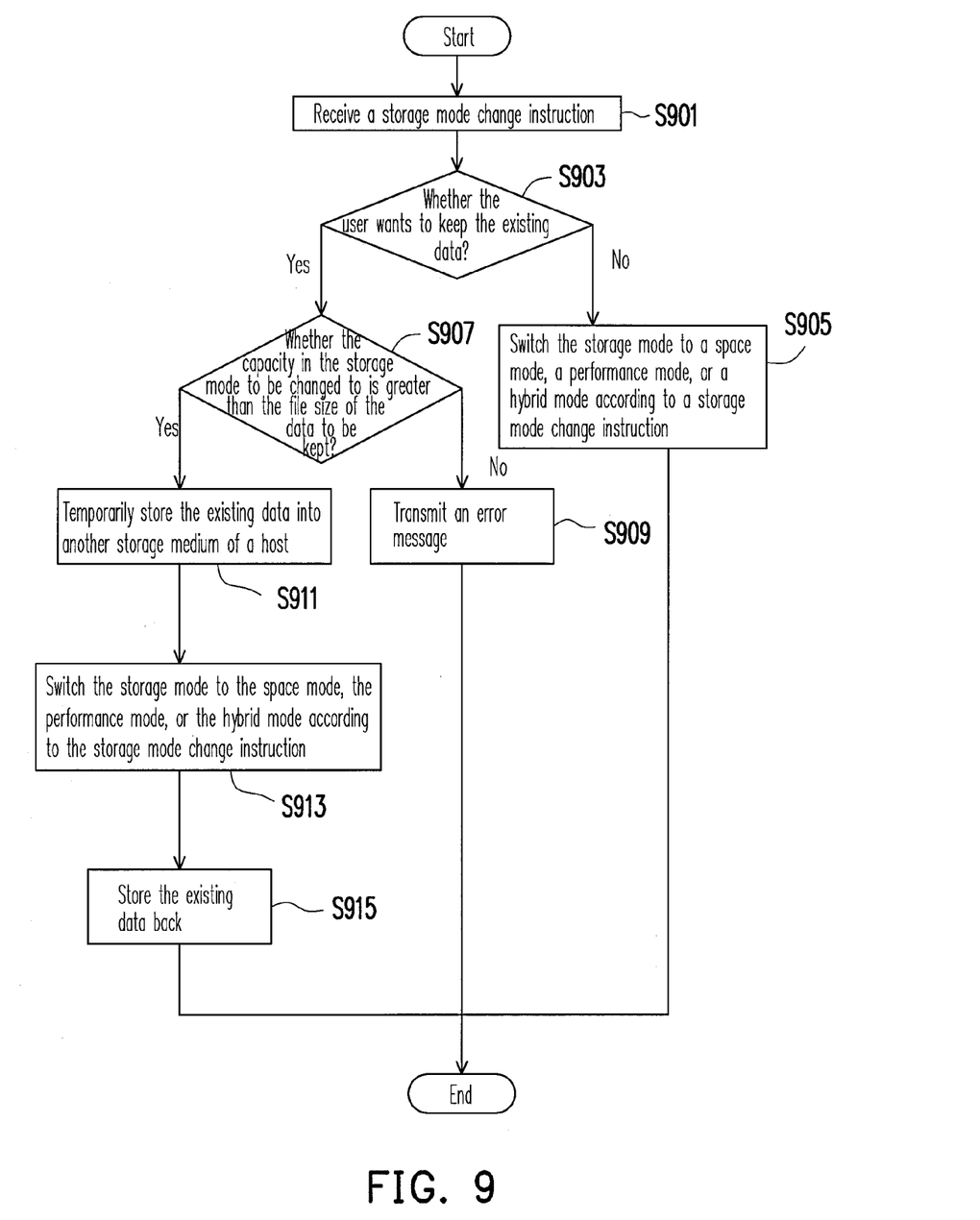
FIG. 9 is a flowchart of a storage mode switching method according to a third embodiment of the present invention.

FIG. 9 is a flowchart of a storage mode switching method according to the third embodiment of the present invention.

Referring to FIG. 9, in step S901, the flash memory storage apparatus 100 receives a storage mode change instruction. In the present embodiment, the storage mode change instruction is transmitted by an application program installed in the host 200. To be specific, a user can issue a storage mode change instruction by executing the application program in the host when the flash memory storage apparatus 100 is connected to the host 200 and is in operation.

In step S903, whether the user wants to keep the existing data in the flash memory storage apparatus 100 and the storage mode to be changed is determined according to the storage mode change instruction. If it is determined in step S903 that the user does not want to keep the existing data, then in step S905, the storage mode is switched to the space mode, the performance mode, or the hybrid mode according to the storage mode change instruction, and this operation is similar to the operation illustrated in FIG. 8.

If it is determined in step S903 that the user wants to keep the existing data, whether the capacity in the storage mode to be changed to according to the storage mode change instruction is greater than the file size of the data to be kept is determined in step S907. If it is determined in step S907 that the capacity in the storage mode to be changed to is smaller than the file size of the data to be kept, an error message is transmitted to the application program and the process is terminated without performing any switching operation, as in step S909. If it is determined in step S907 that the capacity in the storage mode to be changed to is greater than the file size of the data to be kept, the existing data is temporarily stored into another storage medium (for example, a hard disk or a random access memory) of the host 200, as in step S911. After that, in step S913, the storage mode is switched to the space mode, the performance mode, or the hybrid mode according to the storage mode change instruction, and this step is the same as the step S905. Finally, in step S915, the existing data is stored back into the flash memory storage apparatus 100.

Fourth Embodiment

The hardware structure and the operation of the flash memory in the fourth embodiment are the same as those in the first embodiment (as illustrated in FIGS. 1, 2, 3, 5, 6, and 7) therefore will not be described herein. The difference between the fourth embodiment and the third embodiment is that in the fourth embodiment, the existing data is temporarily stored into a temporary space of the flash memory in the flash memory storage apparatus.

Figure 10:
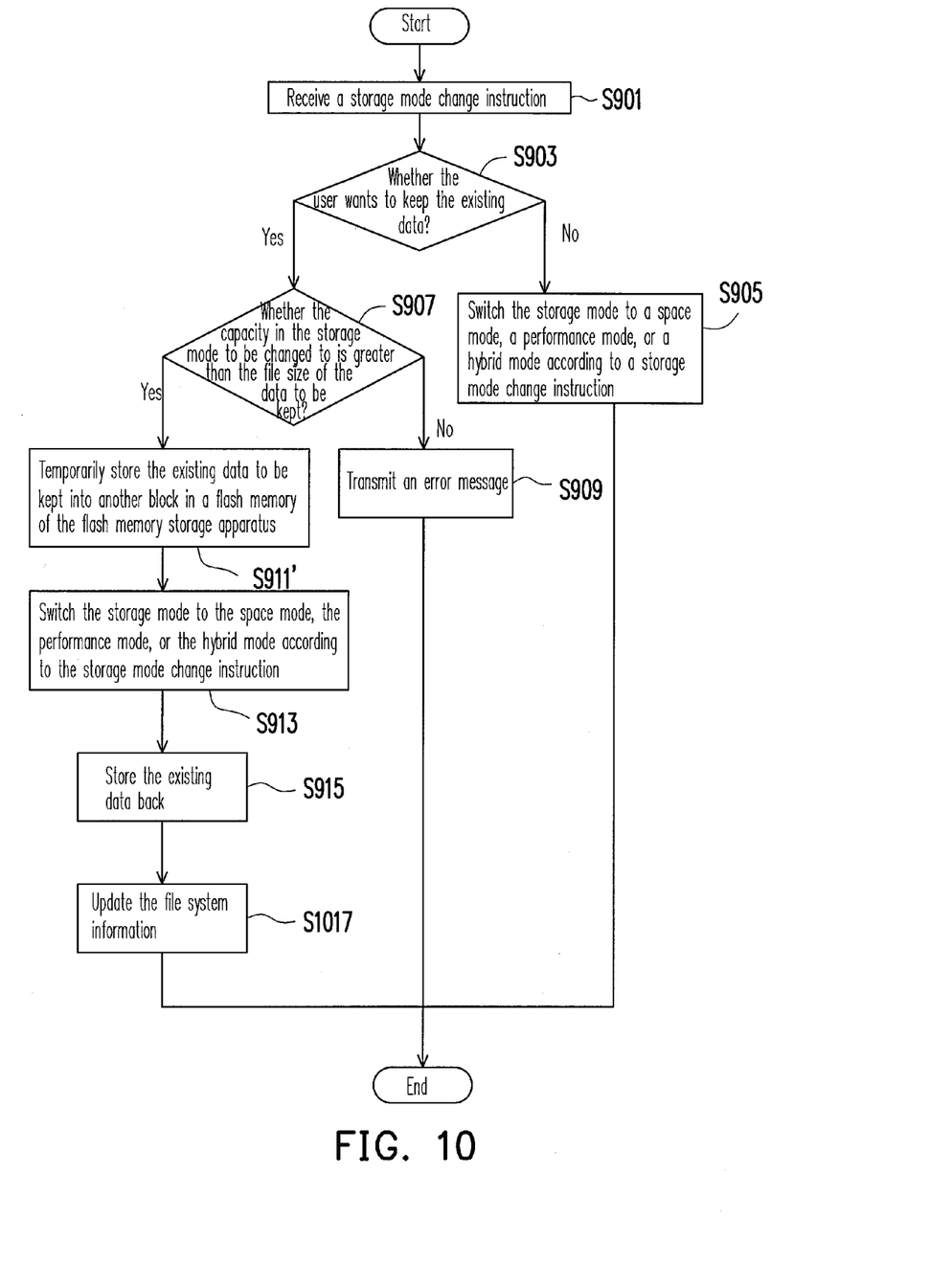
FIG. 10 is a flowchart of a storage mode switching method according to a fourth embodiment of the present invention.

FIG. 10 is a flowchart of a storage mode switching method according to the fourth embodiment of the present invention.

Referring to FIG. 10, the storage mode switching method illustrated in FIG. 10 is substantially the same as the method illustrated in FIG. 9, and the difference is that the existing data to be kept is temporarily stored into a temporary space in the flash memory of the flash memory storage apparatus (step S911'). The other steps are the same as those illustrated in FIG. 9 therefore will not be described herein.

In the present embodiment, the existing data to be kept is temporarily stored in the temporary space of the flash memory in the flash memory storage apparatus, wherein the temporary space is also at least one block in the flash memory. Thus, when the controller 160 is about to switch the storage mode of a block, first the controller 160 temporarily stores existing data in blocks into at least one of other unused blocks, and after the switching of the blocks is completed, the controller 160 stores the existing data back to the switched block and then continues to the switching of the other blocks. In the present embodiment, because the address for storing the data is changed by the switching operation, the file system information (for example, a master boot record (MBR) or a file allocation table (FAT)) is instantly updated (step S1017) so as to allow the system to identify the original existing data.

It should be understood that the present invention is not limited to the execution order illustrated in FIGS. 4, 8, 9, and 10. In other words, the storage mode switching method may also be executed in other sequences without departing the spirit of the present invention.

In overview, the present invention provides a flash memory storage apparatus having multiple storage modes. The flash memory storage apparatus in the present invention can provide different storage modes according to the preference of a user so that the user's requirement of storing different data can be met. For example, important data can be stored in the performance mode so that the reliability thereof can be improved, and large data files can be stored in the space mode. Moreover, besides improving the reliability of data storage, the flash memory storage apparatus provided by the present invention also improves the data writing speed in the performance mode. Thus, a better performance can be provided when the flash memory storage apparatus is used for specific purposes (for example, for executing the ready-boost function).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory storage apparatus, comprising:
   at least one multi level cell (MLC) NAND flash memory, having a plurality of blocks for storing data, wherein each of the blocks comprises an upper page and a lower page, and the flash memory is programmed in multiple phases, wherein the lower page is programmed during a first phase, the upper page is programmed during another phase, and the writing speed of the lower page is faster than the writing speed of the upper page;
   a flash memory controller, electrically connected to the MLC NAND flash memory and configured to switch a storage mode of the flash memory storage apparatus to a performance mode or a space mode; and
   a host transmission bus, electrically connected to the flash memory controller for communicating with a host,
   wherein during the flash memory storage apparatus is enabled, the flash memory controller uses one of the performance mode and the space mode to write data in the MLC NAND flash memory,
   wherein the flash memory controller uses only the lower pages of the blocks for storing data without using the upper pages of the blocks for storing data when the storage mode is the performance mode,
   wherein the flash memory controller uses both the upper pages and the lower pages of the blocks for storing data when the storage mode is the space mode.

2. The flash memory storage apparatus according to claim 1, wherein the flash memory controller further switches the storage mode of the flash memory storage apparatus to a performance mode, a space mode or a hybrid mode,
   wherein during the flash memory storage apparatus is enabled, the flash memory controller uses one of the performance mode, the space mode and the hybrid mode to write data in the MLC NAND flash memory,
   wherein when the storage mode is the hybrid mode, the flash memory controller groups the blocks into a first division and a second division, uses only the lower pages of the blocks in the first division for storing data and uses both the upper pages and the lower pages of the blocks in the second division for storing data.

3. The flash memory storage apparatus according to claim 1, wherein the flash memory controller switches the storage mode of the flash memory storage apparatus according to an instruction transmitted by an application program in the host.

4. The flash memory storage apparatus according to claim 1, further comprising a selection switch selected by a user and the flash memory controller switches the storage mode of the flash memory storage apparatus according to the selection switch.

5. The flash memory storage apparatus according to claim 1, wherein the upper page comprises a plurality of pages having different writing speeds.

6. A flash memory controller, for a flash memory storage apparatus having a MLC NAND flash memory, each block in the flash memory comprises an upper page and a lower page, and the MLC NAND flash memory is programmed in multiple phases, wherein the lower page is programmed during a first phase, the upper page is programmed during another phase, and the writing speed of the lower page is faster than the writing speed of the upper page, the flash memory controller comprising:
   a microprocessor unit;
   a flash memory interface, electrically connected to the microprocessor unit for accessing the flash memory;
   a buffer memory, electrically connected to the microprocessor unit for temporarily storing data; and
   a memory management module, electrically connected to the microprocessor unit for and configured to switch a storage mode of the flash memory storage apparatus to a performance mode or a space mode,
   wherein during the flash memory storage apparatus is enabled, the memory management module uses one of the performance mode and the space mode to write data in the MLC NAND flash memory,
   wherein the memory management module uses only the lower pages of the blocks for storing data without using the upper pages of the blocks for storing data when the storage mode is the performance mode,
   wherein the memory management module uses both the upper pages and the lower pages of the blocks for recording data when the storage mode is the space mode.

7. The flash memory controller according to claim 6, wherein the memory management module further switches the storage mode of the flash memory storage apparatus to a performance mode, a space mode or a hybrid mode,
wherein during the flash memory storage apparatus is enabled, the memory management module uses only one of the performance mode, the space mode and the hybrid mode to write data in the MLC NAND flash memory.

8. The flash memory controller according to claim 7, wherein when the storage mode is the hybrid mode, the memory management module groups the blocks into a first division and a second division, uses only the lower pages of the blocks in the first division for storing data and uses both the upper pages and the lower pages of the blocks in the second division for storing data.

9. The flash memory controller according to claim 6, wherein the memory management module switches the storage mode of the flash memory storage apparatus according to an instruction transmitted by an application program in the host.

10. The flash memory controller according to claim 6, further comprising a selection switch circuit for detecting the storage mode to be used by a user.

11. A storage mode switching method, suitable for a flash memory storage apparatus having a flash memory, wherein the flash memory is a MLC NAND flash memory, each block in the flash memory comprises an upper page and a lower page, and the flash memory is programmed in multiple phases, wherein the lower page is programmed during a first phase, the upper page is programmed during another phase, and the writing speed of the lower page is faster than the writing speed of the upper page, the storage mode switching method comprising:
switching the storage mode of the flash memory storage apparatus from a first programming mode to second programming mode, wherein the first programming mode is different from the second programming mode, and wherein during the flash memory storage apparatus is enabled, only one of the programming modes is existed in the MLC NAND flash memory; and
temporarily storing existing data in the flash memory storage apparatus into a storage medium of a host when the storage mode of the flash memory storage apparatus is switched, and storing the existing data back to the flash memory storage apparatus after the switching is completed.

12. The storage mode switching method according to claim 11, wherein the first programming mode is using the upper pages and the lower pages of the blocks in the flash memory for storing data, and the second programming mode is only using the lower pages of the blocks for storing data without using the upper pages of the blocks.

13. The storage mode switching method according to claim 11, wherein the first programming mode is using the upper pages and the lower pages of the blocks in the flash memory for storing data, and the second programming mode is only the lower pages are used for storing data in some blocks of the flash memory, and both the upper pages and the lower pages are used for storing data in the other blocks of the flash memory.

14. The storage mode switching method according to claim 11, further comprising:
temporarily storing existing data in a currently switched block into an unused block of the flash memory when the storage mode of the flash memory storage apparatus is switched, and storing the existing data block to the switched block and updating a file system information of the flash memory storage apparatus after the switching is completed.

* * * * *